(12) United States Patent
Barton et al.

(10) Patent No.: US 7,977,633 B2
(45) Date of Patent: Jul. 12, 2011

(54) PHASE PLATE, IN PARTICULAR FOR AN ELECTRON MICROSCOPE

(75) Inventors: Physiker Bastian Barton, Frankfurt am Main (DE); Rasmus R. Schroeder, Heidelberg (DE)

(73) Assignee: Max-Planck-Gesellschaft zur Foerderung der Wissenschaften e. V., Munich (DE)

( * ) Notice: Subject to any disclaimer, the term of this patent is extended or adjusted under 35 U.S.C. 154(b) by 317 days.

(21) Appl. No.: 12/199,675

(22) Filed: Aug. 27, 2008

(65) Prior Publication Data
US 2010/0051807 A1    Mar. 4, 2010

(51) Int. Cl.
*G01N 23/00* (2006.01)
(52) U.S. Cl. .................... 250/311; 250/396 R; 850/9
(58) Field of Classification Search .................. 250/311
See application file for complete search history.

(56) References Cited

U.S. PATENT DOCUMENTS

| | | | | |
|---|---|---|---|---|
| 5,814,815 A | * | 9/1998 | Matsumoto et al. | 250/311 |
| 7,737,412 B2 | * | 6/2010 | Jin et al. | 250/396 R |
| 7,741,602 B2 | * | 6/2010 | Benner et al. | 250/311 |
| 7,902,506 B2 | * | 3/2011 | Schroder et al. | 250/311 |

FOREIGN PATENT DOCUMENTS

| EP | 1845551 | 10/2007 |
|---|---|---|
| EP | 1959475 | 8/2008 |

OTHER PUBLICATIONS

Kuniaki Nagayama et al., "Development of phase plates for electron microscopes and their biological application," Eur Biophys J (2008) 37:345-358, XP-019586216.

* cited by examiner

*Primary Examiner* — Phillip A Johnson
(74) *Attorney, Agent, or Firm* — Black Lowe & Graham, PLLC

(57) ABSTRACT

The invention concerns a phase plate, in particular for an electron microscope, which is disposed in an electron beam path (4), comprises at least one thin film (8, 8a-h), which thin film is at least partially permeable to electron beams, wherein the thin film (8, 8a-h) comprises electrically conductive material, is connected to a predeterminable electrical voltage (12, 12a-e) and is equipped with at least one through-hole (9, 9a-c).

13 Claims, 7 Drawing Sheets

PHASE PLATE, IN PARTICULAR FOR AN ELECTRON MICROSCOPE

The invention concerns a phase plate, in particular for an electron microscope, which is disposed in an electron beam path and which consists of at least one thin film, which thin film is at least partially permeable to electron beams, in accordance with the preamble of claim 1. The invention further concerns an electron microscope containing at least one of these phase plates.

Phase contrast microscopy is a universally known microscopic method of imaging samples, which have a greater effect on the phase than on the amplitude of an illuminating beam. The samples, which are also designated phase objects, are semi-transparent. The phase of the illuminating beam is affected by interaction of the sample material with the illuminating beam.

In optical microscopy, in which the illuminating beam is light, phase contrast microscopy is an established imaging method. By means of a phase ring, which is disposed in the back focal plane of the objective of a light-optical microscope, the beam originating from the sample is phase-shifted by zero order of diffraction relative to the first order of diffraction. The interference of the higher orders of diffraction with the phase-shifted main maximum provides the desired contrast-rich image.

A phase contrast microscopy method of this kind was also proposed for electron microscopy, in which the illuminating beam comprises electron waves. Interest in physical phase-contrast methods exists particularly in the case of the transmission electron microscope (TEM), where samples are penetrated by electrons and, following the passage of the electrons through the samples, the samples are imaged optoelectronically, since the samples being examined are necessarily thin, unstained ones, which are displayed through a small phase shift.

In "Cryst. Res. Technol." by S. Zemlin, volume 33, 1998, pp. 1097-1111, the basic principles of the electron-microscopic phase-contrast method are explained. Details of the wave-optical description of phase-contrast electron microscopy are given by way of illustration. Further explanations of wave optics and vector representation of the phase contrast may be derived, in particular, from the publications and textbooks on electron microscopy cited here.

The enlarged image of the sample generated in the image plane with the geometrical optics system of an electron microscope arises as a result of interference by electrons, which on the one hand are diffracted at the sample, and on the other penetrate the sample undiffracted. The properties of the interference image can be described with the phase contrast transfer function (PCTF). The PCTF indicates which spatial frequencies of the sample are transferred, and to what extent, from the sample into the image by virtue of the instrumental properties. For a conventional TEM with brightfield imaging, the PCTF is, in first approximation, a sine function according to:

$$PCTF(k)=2\sin e(\gamma(k)),$$

wherein k is the absolute sum of the wave vector (spatial frequency). The argument of the sine function is the wave aberration, which depends non-linearly on k:

$$\gamma(k)=\pi/2\ (C_s\lambda^3 k^4 - 2\Delta z\ \gamma k^2),$$

wherein $C_s$ is the spherical aberration coefficient, $\gamma$ is the electron wavelength and $\Delta z$ is the defocusing value.

The spatial frequency dependence shows that low spatial frequencies (large structures) are captured in the image to only a small extent or not at all. The imaged object therefore appears with especially weak contrast. The contrast transfer disappears completely in a TEM without lens error ($C_s$=0 mm) and for a picture in Gaussian focus ($\Delta z$=0 mm).

In order nevertheless to generate contrast, under the conventional method with infinite coefficients of spherical aberration, a small defocus is set, leading, however, to information loss as a result of contrast delocalisation.

A true phase contrast method is based on introduction of the phase plate into the back focal plane of the objective lens of the electron microscope. The phase plate is generally a device that causes an additional phase shift to be introduced between the scattered wave component and the unscattered wave component. When this equals 90°, the PCTF is converted into a cosine function according to:

$$PCTF_{\pi/2}(k)=2\cos(\gamma(k)).$$

With this PCTF, a complete contrast transfer can take place, including under optimum optical conditions, i.e. complete aberration correction and no defocusing. The maximum image information is achieved.

A general problem encountered in using conventional phase contrast methods in the TEM concerns the introduction of the phase plate into the optoelectronic beam path. By contrast with the use of a phase ring in the case of the light-optical microscope, additional structures in electron microscopy are generally associated with undesirable signal losses or image distortions.

A thin-film phase plate for phase-contrast microscopy is known from DE 101 14 949 A1. The thin-film phase plate consists of a thin film disposed on a diaphragm mount in the back focal plane of the objective. The thin film contains a through-hole through which the unscattered electron waves pass unhindered. On the other hand, the electron waves scattered by the sample are phase-shifted as a result of the electron material interaction in the thin film. The thin film is intended to prevent the charging of a film, e.g. taking the form of a carbon film, which manipulates the phase as it occurs by means of its internal potential. Charging of a carbon film is thereby deliberately prevented by means of the conductive film. However, charging phenomena may occur on the thin film following contamination with impurities from the electron microscope, causing uncontrolled phase shifts and image distortions and thereby having a negative effect on images. This gives rise to a reduction in resolving capacity, another reason being that the film can no longer reliably execute its function of charge prevention. In the case of the invention described in DE 101 14 949 A1, the phase shift of the electron wave takes place as a result of the internal electrostatic potential of an outwardly uncharged thin film, so a film thickness of 20-30 nm is necessary. However, on passing through the electron wave, a film of this thickness leads to coherence losses and thus to signal losses. The signal-to-noise ratio of the images and the maximum achievable resolution are thereby reduced.

Accordingly, it is an object of the invention to make available a phase plate, in particular for an electron microscope, and an electron microscope with a phase plate of this kind, with which an increased signal-to-noise ratio and thereby an increased resolution is achieved.

This object is achieved by a phase side in accordance with the features of claim 1 and by an electron microscope in accordance with the features of claim 13.

A significant point of the invention lies in the fact that, in the case of a phase plate, in particular for an electron microscope, which is disposed in an electron beam path and comprises at least one thin film that is permeable, at least partially, to electron beams, this thin film consists of electrically conductive material, is connected to a predeterminable electrical voltage and is equipped with at least one through-hole. As a result of applying an external voltage U, the potential $\Phi_a$ at the location of the conductive thin film is unequal to the potential $\Phi_0$ at the output of the electron source of an electron microscope, and thus an optimum phase shift of $\pi/2$ is obtained, which exists between the electrons that pass the through-hole and the electrons that pass the thin film. This means that the optimised phase shift of $\pi/2$ gives rise to an image with maximum phase contrast as a result of the slowed electrons in the thin film.

By application of a voltage of this kind, a thin film may also be used in the form of a thin film of a size or thickness that can be reduced to e.g. 5 nm, whereas previously thin films of a thickness of e.g. 30 nm had to be used in order to aspire to a phase shift of this kind. This enables a significantly higher transmission and prevents coherence and resolution losses. The information content of the image thereby becomes greater and the achievable resolution is improved.

The phase plate is preferably aligned perpendicular relative to an optical axis of the electron microscope with the through-hole extending in the direction of progression of the electron beam path in order that an unhindered passage of the electrons that are to pass through the hole takes place.

The through-hole is ideally disposed in the centre of a surface of the phase plate, preferably in the optical axis of an electron microscope.

The through-hole may be of a shape that is either circular in cross-section with a specific radius in a range of 0.1-20 µm, preferably 0.3-0.8 µm, or rectangular. Different cross-sectional areas are, of course, also conceivable for the through-hole.

In accordance with a preferred embodiment, the phase plate is disposed, relative to an object to be observed, in a back focal plane of an objective lens of a transmission electron microscope, so that a deliberate passage of the electrons through both the through-hole and the surrounding material of the thin film can take place.

The thin film is preferably disposed, at least in part, on a carrier film, which preferably consists of amorphous material. This brings about not only a stabilised attachment of the thin film in the back focal plane of an electron microscope but also an optimised alignment of the film in relation to the alignment of the electron beam path.

The thin film itself comprises an amorphous material, such as gold, aluminium, silver, platinum, titanium or alloys thereof in order to ensure the electrical conductivity of the film in relation to the applied voltage.

In accordance with a preferred embodiment, the thin film exhibits a thickness in a range of 0.1-50 nm, preferably 0.3-1.0 nm, wherein the carrier film beneath it may exhibit a film thickness in the range 1-100 nm, preferably 5-20 nm.

The phase plate may also be disposed in a group of phase plates disposed one above the other along the electron beam path, wherein, both in this group and when used individually, the phase plate can cover at least sections, i.e. preferably a half-plane, of a diffraction-image plane within the electron microscope.

An electron microscope with a phase plate of this kind is advantageously designed in a manner such that it comprises at least one objective lens, the phase plate, a voltage applied to the phase plate with associated voltage source, an object in an object plane and an illumination system.

Further advantageous embodiments are described in the dependent claims.

The advantages and functionalities can be deduced from the description below in conjunction with the drawings, which show the following:

FIG. 1 in a schematic view, an electron microscope with a phase plate in accordance with a first embodiment of the invention;

FIG. 2 in a schematic view, a section of an electron microscope with a phase plate in accordance with a second embodiment of the invention;

FIG. 3 in a schematic sectional view, an electron microscope with a phase plate in accordance with a third embodiment;

FIG. 4 in a schematic sectional view, an electron microscope with a phase plate in accordance with a fourth embodiment of the invention;

FIG. 5 in a sectional schematic view, an electron microscope with phase plates in accordance with a fifth embodiment of the invention;

FIG. 6 in a schematic view, an electron microscope with phase plates in accordance with a sixth embodiment of the invention;

FIG. 7 in a diagram, a view of the phase shift achieved by the phase plate in accordance with the invention;

FIG. 8 a section of the view shown in FIG. 7;

FIG. 9 in a diagram, a further view of the phase shift achieved with the phase plate in accordance with the invention;

FIG. 10 a section of the view shown in FIG. 9;

FIG. 11 two images with and without the phase plate in accordance with the invention installed in a transmission electron microscope.

Shown in FIG. 1 in a schematic view is a transmission electron microscope (TEM) with a phase plate in accordance with a first embodiment of the invention. Originating from an illumination system 1, electron beams 2 fall onto an object 3 on which the electron beams are scattered in accordance with reference number 4. The scattered electron beams 4 then fall onto an objective lens 5, which generates firstly a diffraction pattern and then an intermediate image of the object. A phase plate 8 is positioned in the vicinity of the back focal plane of the objective lens 5, or more precisely at the location at which the bundle of unscattered beams collected by the lens has the shortest length perpendicular to an optical axis 7 (="crossover").

The electron beams collected at the object lens 5 are then conducted through the phase plate 8 in accordance with reference number 6, wherein certain electron beams pass through a through-aperture or hole 9 and other electron beams pass through the thinly stamped out phase plate 8 and its material.

A voltage is applied to the phase plate 8 from an external voltage source 12.

In an intermediate-image plane, the electron beams 10 that have passed through the phase plate 8 or through its through-hole 9 then fall onto an image plane 11 in order to produce an appropriate phase-contrast image, which is obtained as a result of the passing of the electron beams through the phase plate 8. This becomes a contrast-rich image, as is apparent from e.g. FIG. 11b by comparison with the image reproduced in FIG. 11a, which was not obtained with the phase plate in accordance with the invention.

FIG. 2 shows schematically, in a sectional view, an electron microscope with a phase plate in accordance with a second embodiment of the invention. Identical and synonymous components are provided with identical reference numbers.

The phase plate 8a is again provided with an electrical potential in accordance with the voltage source 12, which is unequal to the potential at the output of the electron source of the TEM and is shown by the earth potential 13. The phase plate 8a is equipped with the centrally-disposed through-hole 9, wherein this through-hole exhibits a circular cross-section with a diameter 16, which preferably equals 1.0 μm. The through-hole is positioned in the vicinity of the back focal plane of the objective lens, or more precisely, at the location at which the bundle of unscattered beams collected by the lens has the shortest length perpendicular to the optical axis, here shown as lying on the optical axis.

The phase plate 8a is retained at both ends, at least partially, by a carrier film 14a for stabilisation purposes, wherein the carrier film may, for example, take a circular form.

The thin film 8a of the phase plate exhibits a thickness 15 of e.g. 5 nm.

The transmission electron microscope is shown by an external wall 17 indicated on the left-hand side.

The phase plate is positioned in the back focal plane of a transmission electron microscope, or more precisely, at the location at which the bundle of unscattered beams collected by the lens exhibits the shortest length perpendicular to the optical axis. The central beam of unscattered electrons is guided through the central hole, whereas scattered electrons pass through the thin film 8a made of conductive and electron-permeable material. Owing to the applied voltage, a potential distribution arises, as explained in greater detail below, whereupon the electron wave is phase-shifted, leading to strong phase contrast in the focussed image, as shown in FIG. 11, of the sample or object 3.

FIG. 3 shows a schematic sectional view of an electron microscope with a phase plate in accordance with a third embodiment of the invention. The phase plate 8b is disposed only on a half-plane relative to the optical axis 7, and is again equipped with a carrier film 14b. Identical and synonymous components are provided with identical reference numbers.

FIG. 4 shows a fourth embodiment of the phase plate in a transmission electron microscope shown in a schematic sectional view. Identical and synonymous components are again provided with identical reference numbers.

The phase plate or thin film 8c is equipped with a carrier film 14c extending over virtually its entire lower surface, which carrier film may consist of e.g. carbon and may be e.g. 10 nm thick.

The thin film 8c itself may be e.g. 5 nm thick.

For the voltage 12, values of e.g. 100 mV are used, wherein these values may also be used for the further embodiments of the phase plate in accordance with the invention. The thin film 8c is advantageously made of silver, aluminium, gold, titanium or similar materials in order to obtain a conductive structure with, at the same time, the smallest possible effect on electrons penetrating this film.

FIG. 5 shows a fifth embodiment of the phase plate with indicated sectional view of the electron microscope. This embodiment involves a group of two or more phase plates with the thin films 8d, 8e and 8f, and, disposed therein on the optical axis 7, or more precisely, at the location at which the bundle of unscattered beams collected by the lens has the shortest length perpendicular to the optical axis, holes 9a, 9b and 9c, wherein the holes 9a, 9b and 9c may exhibit the same diameter or different diameters 16a, 16b and 16c.

Connected to each phase plate is a voltage source 12a, 12b and 12c in order to obtain an electrical potential at the location of the film of the corresponding phase plate 12.

Again, the phase plates may be of equal thickness or exhibit different thicknesses 15a, 15b and 15c.

The electron microscope is shown by way of indication with walls 17, 18 on the left and right-hand sides.

FIG. 6 shows a further, sixth embodiment of the phase plate with associated electron microscope or transmission electron microscope. Identical and synonymous components are provided with identical reference numbers.

Once the electrons have passed through the objective lens 5, which is a collecting lens, they enter a phase plate 8, which is disposed as a half-plane relative to the optical axis, and are scattered or diffracted by means of this phase plate at least on this left-hand side of the electron microscope. Present at the phase plate 8g is a voltage from the voltage source 12d.

A further phase plate 8h is disposed in the other half of the transmission electron microscope relative to the optical axis 7, and is provided with a second voltage from the second voltage source 12e, wherein the voltages from the voltage sources 12d and 12e may be of equal values or may differ.

The image of the phase shift is again obtained in a first intermediate image. The electron beams then pass through a further objective lens 19, which is equipped, in a transfer lens system, with further lenses 21, 22 and may, in addition, be equipped with further lenses and similar elements, as indicated by reference number 20.

The electron beams 23 that have passed through the lens 21 pass through the imaging lens 22 and then exit therefrom as electron beams 24, after which some of them enter the phase plate 8h and thus, as electron beams 25, exhibit a phase shift of $\pi/2$ when they generate an image in the intermediate-image plane 26.

Indicated by the ordinate is the phase shift in units of $\pi/2$ and by the abscissa, the distance from the optical axis, wherein the through-hole is disposed about the 0-value.

Reference number 20 shows a phase-shift characteristic in the case of a phase plate with a through-hole radius of 1 μm. Reference number 21 shows a phase-shift characteristic for a phase plate with a through-hole radius of 500 nm and reference number 22 for a phase plate with a through-hole radius of 300 nm. The relative phase shift shown here from unscattered to scattered electron waves by virtue of the phase plate as a function of the penetration distance from the optical axis shows that the desired phase-shift characteristic occurs all the faster the smaller the radius of the through-hole. In each case, the voltage applied to the phase plate is here adjusted in such a manner that for the phase shift, large distances from the optical axis are always 90°.

Figure 9:
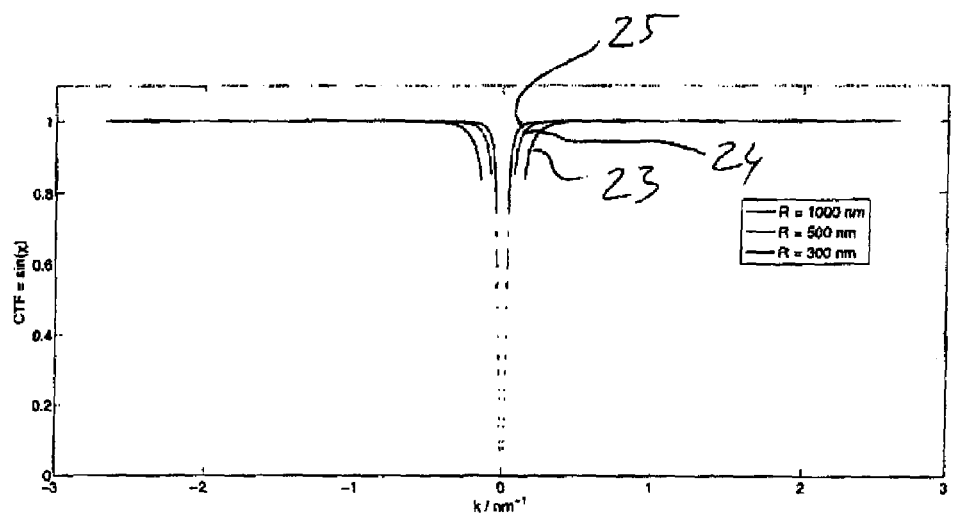
Figure 10:
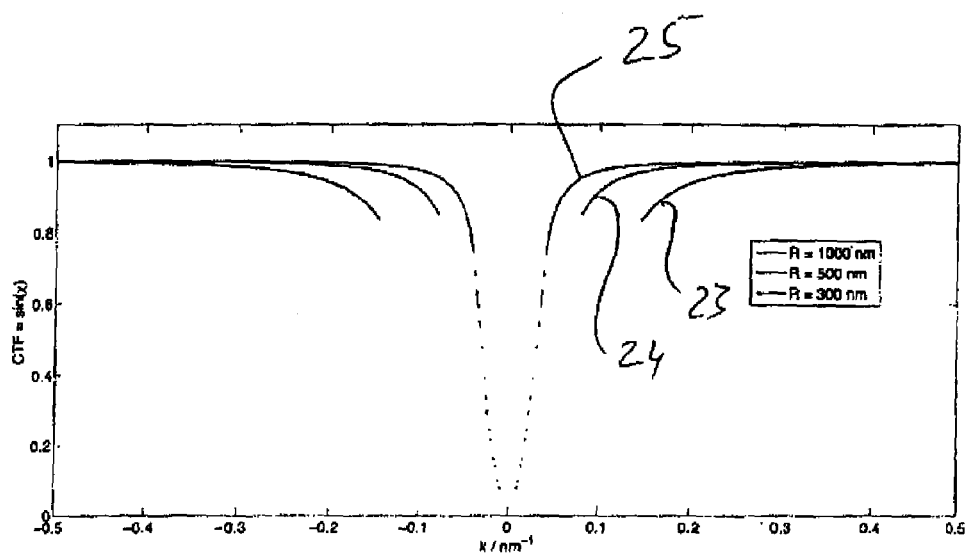

Shown in FIG. 9 and in an enlarged view in FIG. 10 is a diagram of the phase-contrast transfer for phase plates with through-holes exhibiting different radii. Here, the phase-contrast transfer function (PCTF) is shown in the absence of all other lens aberrations, i.e. the object to be imaged is viewed in Gaussian focus and all higher aberrations are ignored, on passage of the unscattered central beam through the phase-plate hole, with three different hole radii. The phase contrast very rapidly reaches a virtually optimum value of more than 80% in accordance with the Table below as a function of the spatial frequency of the structure factors of the object in the diffraction plane. By contrast with the use of an outwardly uncharged film as the phase plate, an increase in contrast is here achieved even for those spatial frequencies corresponding to distances between axes r within the central hole.

The physical explanation of the operating mode of the phase plates in accordance with the invention is given below:

The electrical field E above and below the phase plate is assumed to be homogeneous, $$-E_1 = E_2 = E > 0 \quad (1)$$

The potential is:

$$\Phi(r, z) = \Phi_0 - \frac{2E}{\pi}|z|\left(\arctan\mu + \frac{1}{\mu}\right) \quad (2)$$

with $$\mu = \left[\left(\frac{z^2}{2R^2} + \frac{r^2}{2R^2} - \frac{1}{2}\right) + \left\{\frac{4z^2}{2R^2} + \left(\frac{z^2}{R^2} + \frac{r^2}{R^2} - 1\right)^2\right\}^{\frac{1}{2}}\right]^{\frac{1}{2}}. \quad (3)$$

Here, z is the coordinate along the optical axis of the TEM (phase-plate plane at z=0) and R is the radius of the phase-plate hole.

On the axis of symmetry (r=0):

$$\Phi_{ax} = \Phi_0 - \frac{2E}{\pi} R\left(\frac{z}{R}\arctan\frac{z}{R} + 1\right). \quad (4)$$

The phase shift on diffraction-free passage of the electrons through the phase plate with a distance r from the optical axis is:

$$X(r) = \frac{\pi e}{\lambda U} \frac{m_e c^2 + eU}{m_e c^2 + eU/2} \int_{-\infty}^{+\infty} \phi(r,z) dz \quad (5)$$

(e: elementary charge, λ: De Broglie wavelength of electrons, U: acceleration voltage of the TEM, $m_e c^2$: quiescent energy of electron) and on the optical axis (r=0)

$$X_{ax} = \frac{\pi e}{\lambda U} \frac{m_e c^2 + eU}{m_e c^2 + eU/2} \int_{-\infty}^{+\infty} \phi_{ax}(z) dz = const. \quad (6)$$

As relative phase shift of scattered and unscattered electrons, we get:

$$\Delta X(r) = X(r) - X_{ax}. \quad (7)$$

Figure 7:
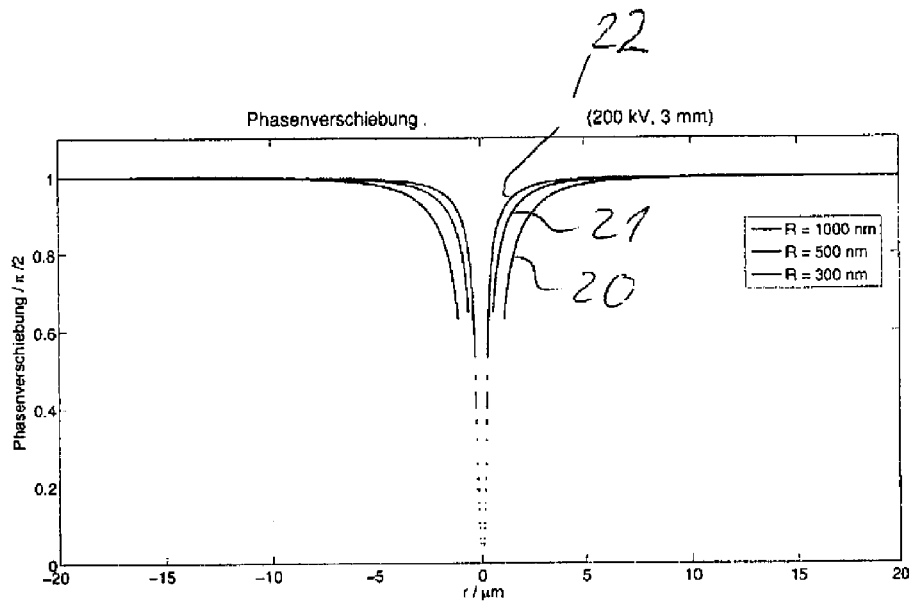
FIG. 7 shows, in a phase-shift diagram, the phase shift that can be obtained by means of a phase-plate assembly in accordance with FIGS. 1-6.
Figure 8:
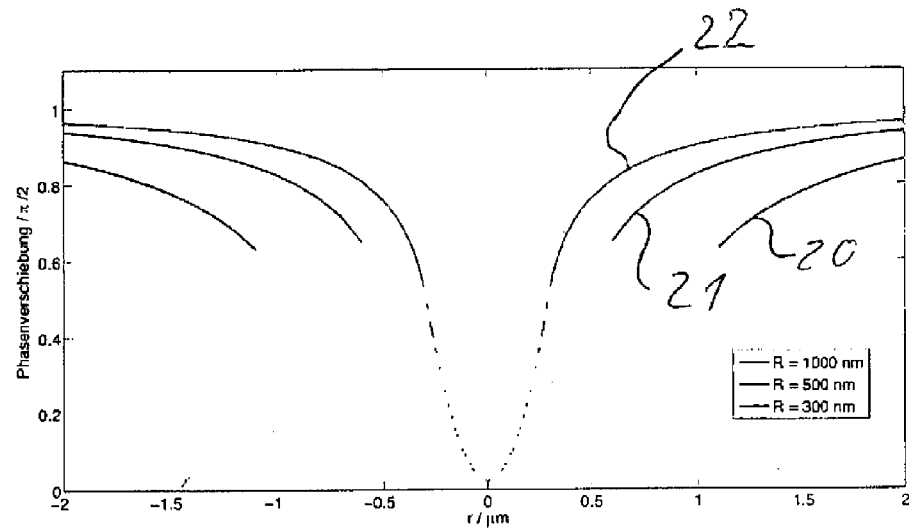
FIG. 8 shows an enlarged view of the central area of the diagram in accordance with FIG. 7.

ΔX is shown in FIGS. 7 and 8 as a function of the geometric distance from the origin of the back focal plane of the objective.

The spatial frequency k (corresponds to the reciprocal coordinate in the Fourier space of the object structure factors) relates to the geometrical distance r in the following manner:

$$k = \frac{r}{\lambda f} \quad (f: \text{focal length of objective lens}). \quad (8)$$

The relative phase shift ΔX(r) caused by the potential distribution may be used as an optoelectronic "Zernike" phase plate (analogous to "λ/4-laminae" in light-optical microscopy).

In FIGS. 9 and 10, the resultant phase-contrast transfer function (PCTF):

$$-1/2 PCTF((\Delta X(k)) = \text{sine}\Delta X(k) \quad (9)$$

is shown in the absence of all other lens aberrations (i.e. image with object in Gaussian focus, all higher aberrations ignored) on passage of the unscattered central beam through the phase-plate hole with r=0 and for three different hole radii. It is assumed here that the potential applied to the phase plate is always adjusted in a manner such that:

$$\Delta X(r \rightarrow \pm\infty) = \pi/2 \text{ or } 90°.$$

For a typical TEM (U=200 kV, f=3.0 mm) the PCTF generated by the phase plate (R=300 nm) is characterised by:

TABLE

| −½ PCTF | k [nm⁻¹] | 1/k [nm] |
|---|---|---|
| 90% | 0.058 (0.012) | 17 (85) |
| 80% | 0.045 (0.009) | 22 (110) |
| 53% | 0.033 (0.007) | 30 (150) |

The values in brackets apply to a 200 kV TEM with an extended focal length of f=15 mm.

The focal length $z_F$ of the setup may be roughly estimated:

$$z_F = -2\frac{\phi_a}{E}. \quad (10)$$

It may be assumed that the undesirable diffraction effect of the phase plate is therefore very small, i.e. in the range of a plurality of m, whereas the focal length of the objective lens of the TEM lies in the range of a few mm.

Figure 11A:
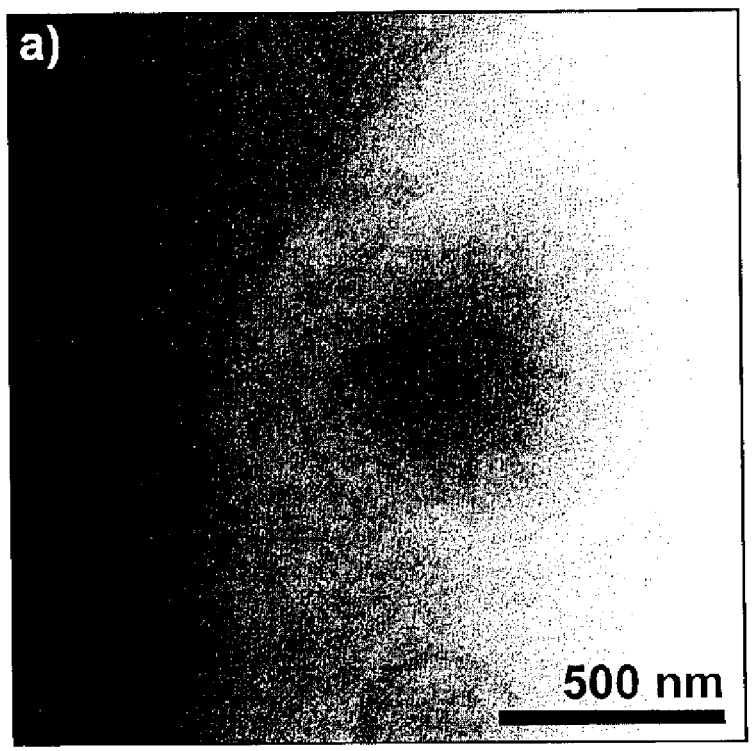
Figure 11B:
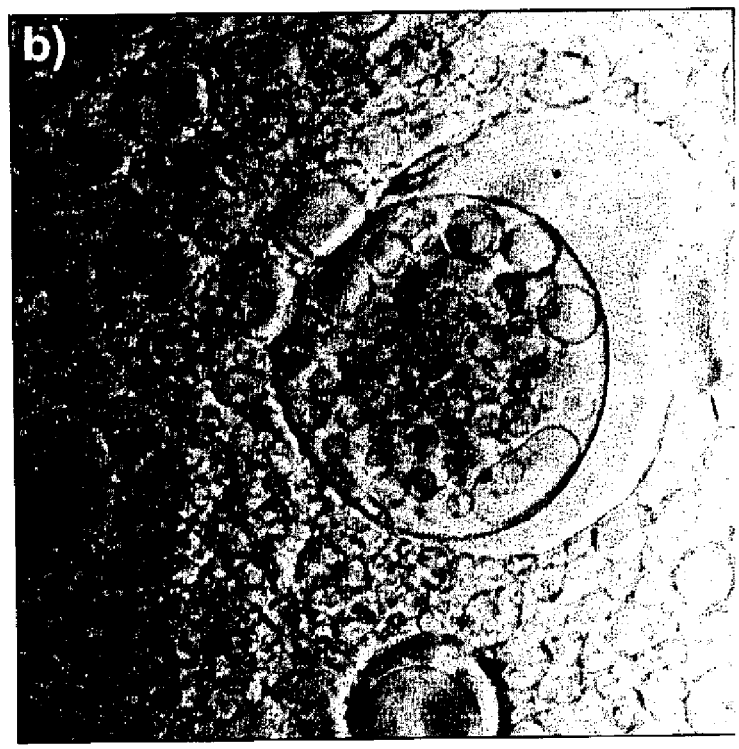

FIG. 11 shows TEM images of native membrane vesicles with ice embedding.

a) Conventional image close to Gaussian focus.

b) Image of the same object with a Hilbert phase plate made of carbon film in the back focal plane of the objective, in Gaussian focus. All pictures were taken with a Tecnai G2 "Polara" with an acceleration voltage of 300 kV and a 4 k×4 k pixel CCD camera (with 2 k×2 k binning) and zero-loss energy-filtered.

All features disclosed in the application documentation are claimed as essential for the invention to the extent that, either individually or in combination, they are novel relative to the prior art.

LIST OF REFERENCE NUMBERS

Figure 1:
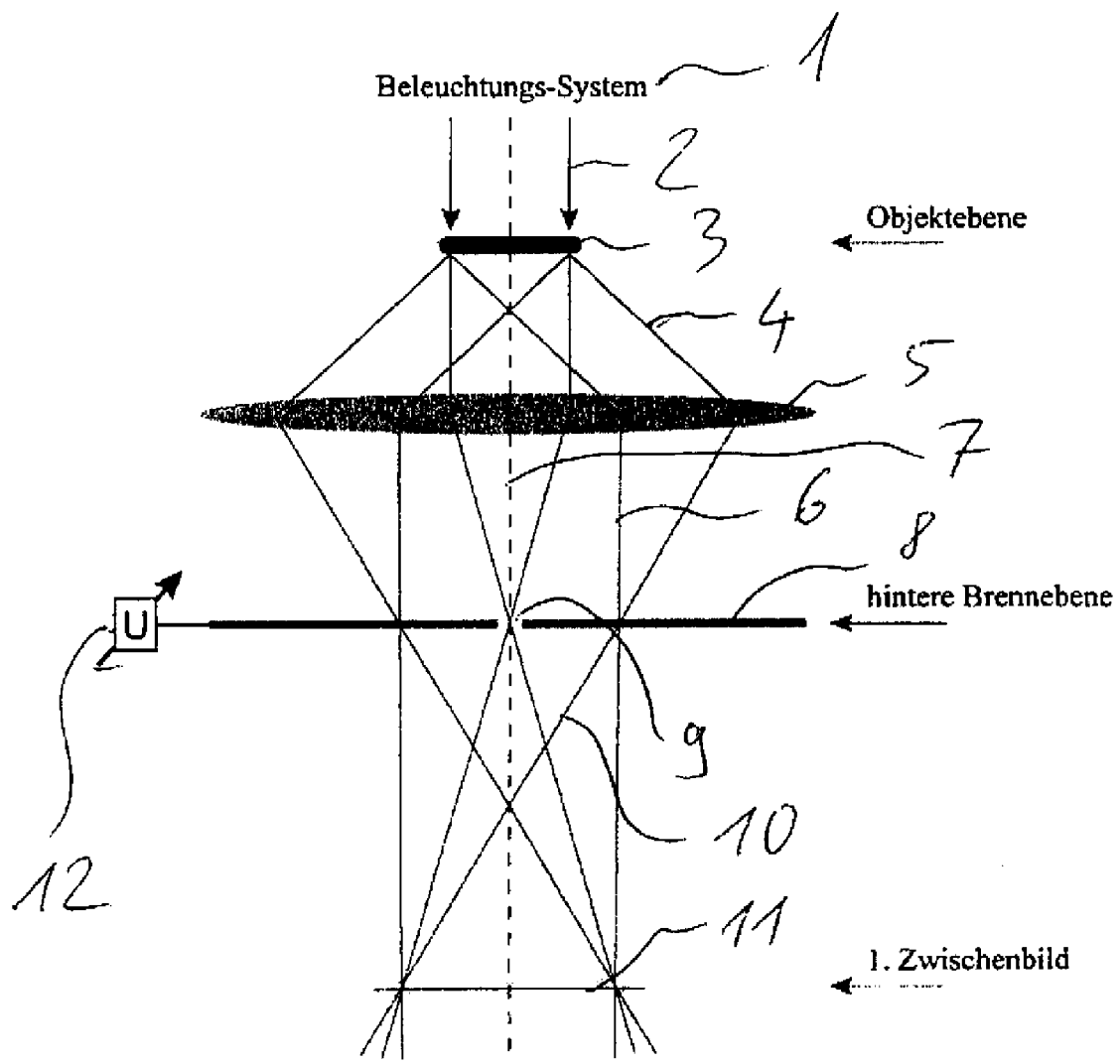
Figure 2:
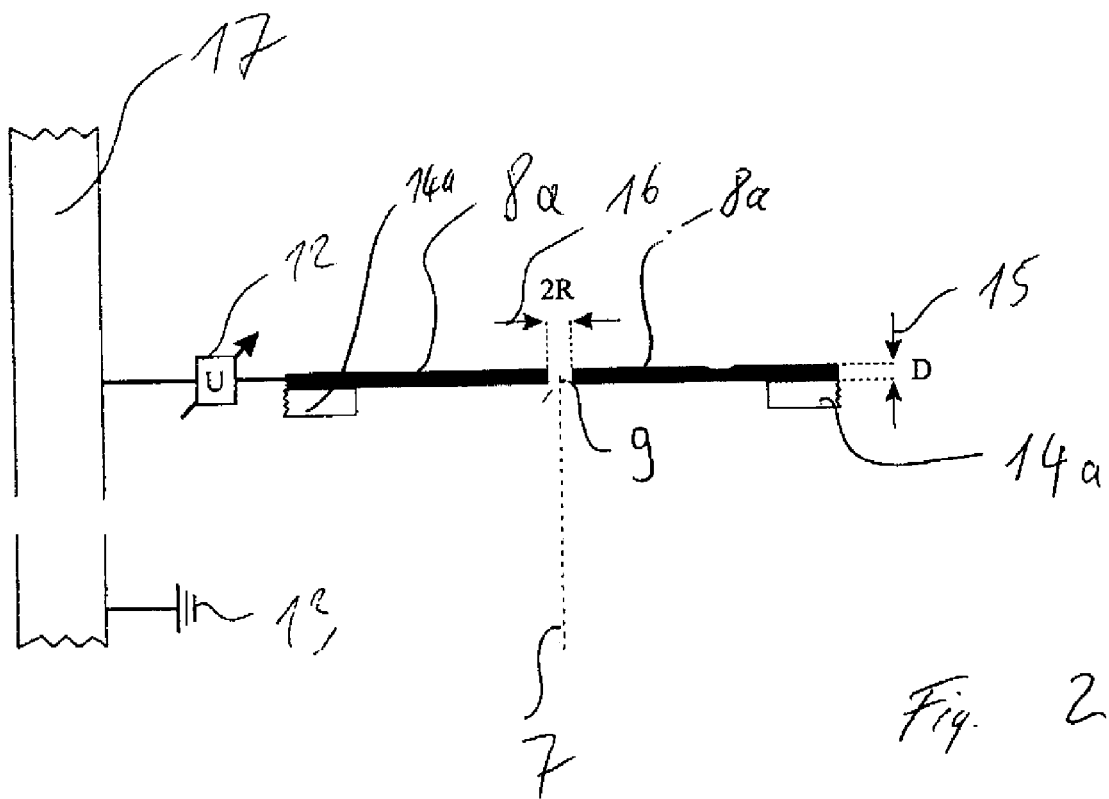
Figure 3:
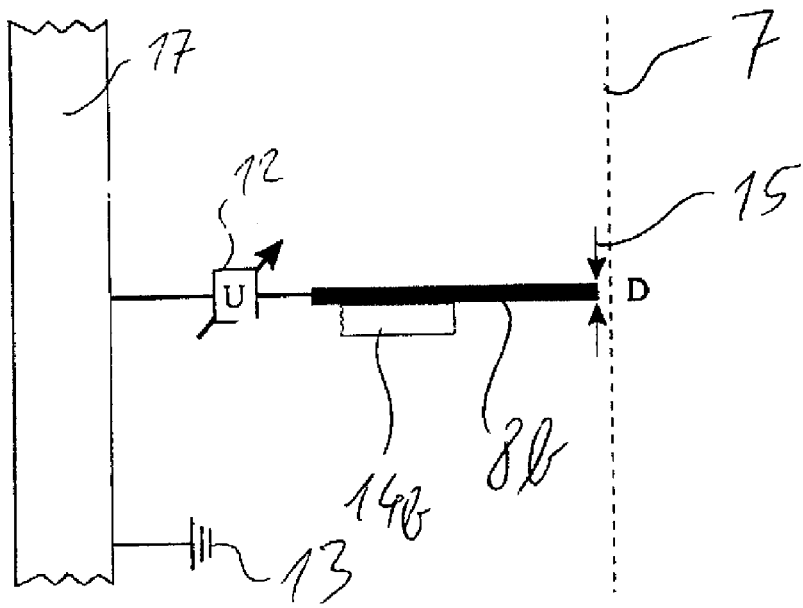
Figure 4:
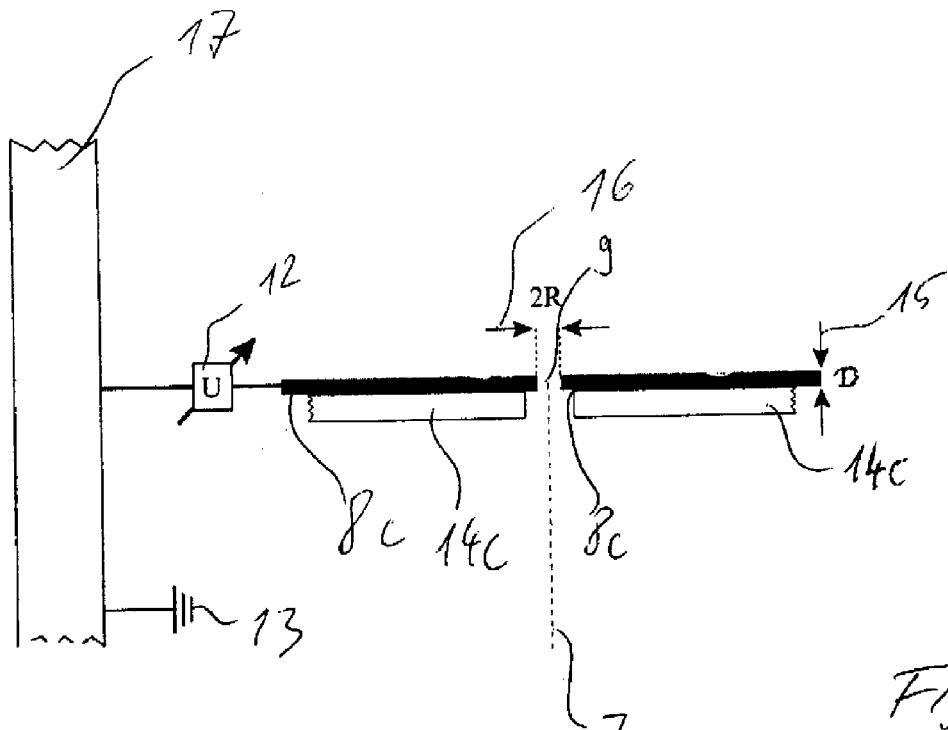
Figure 5:
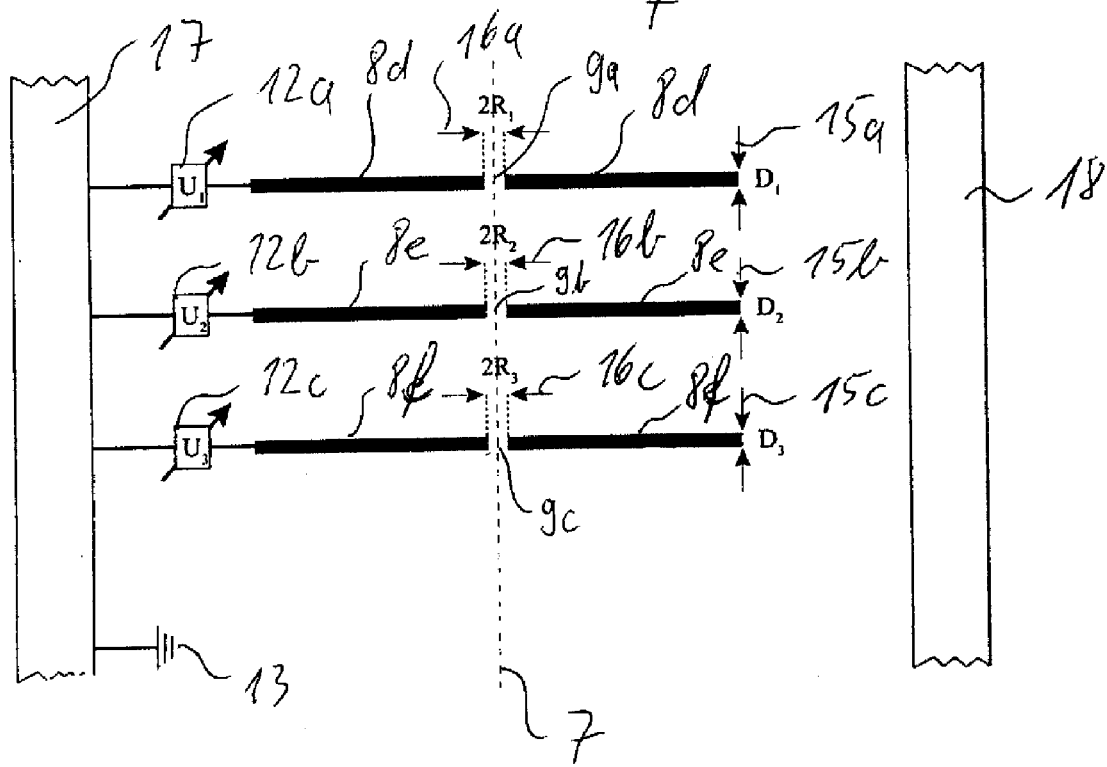

1 Illumination system
2 Electron beams
3 Object
4 Scattered electron beams
5 Objective lens
6 Passage of the electron beams through the phase plate
7 Optical axis
8,8a Phase plate
8c-f Thin film
8g,8h Phase plate
9 Through-hole
9a-c Holes
10 Electron beams
11 Image plane
12 Voltage
12a-c Voltage source
13 Potential
14a-c Carrier film
15 Thickness
16,16a-c Diameter
17,18 Left- and right-hand external wall
19 Objective lens
20 Phase-shift characteristic
21,22 Further lenses 23,24,25 Electron beams
26 Intermediate-image plane
Captions to FIG. 1

| Beleuchtungs-System | Illumination system |
|---|---|
| Objektebene | Object plane |
| hintere Brennebene | Back focal plane |
| 1. Zwischenbild | First intermediate image |

Figure 6:
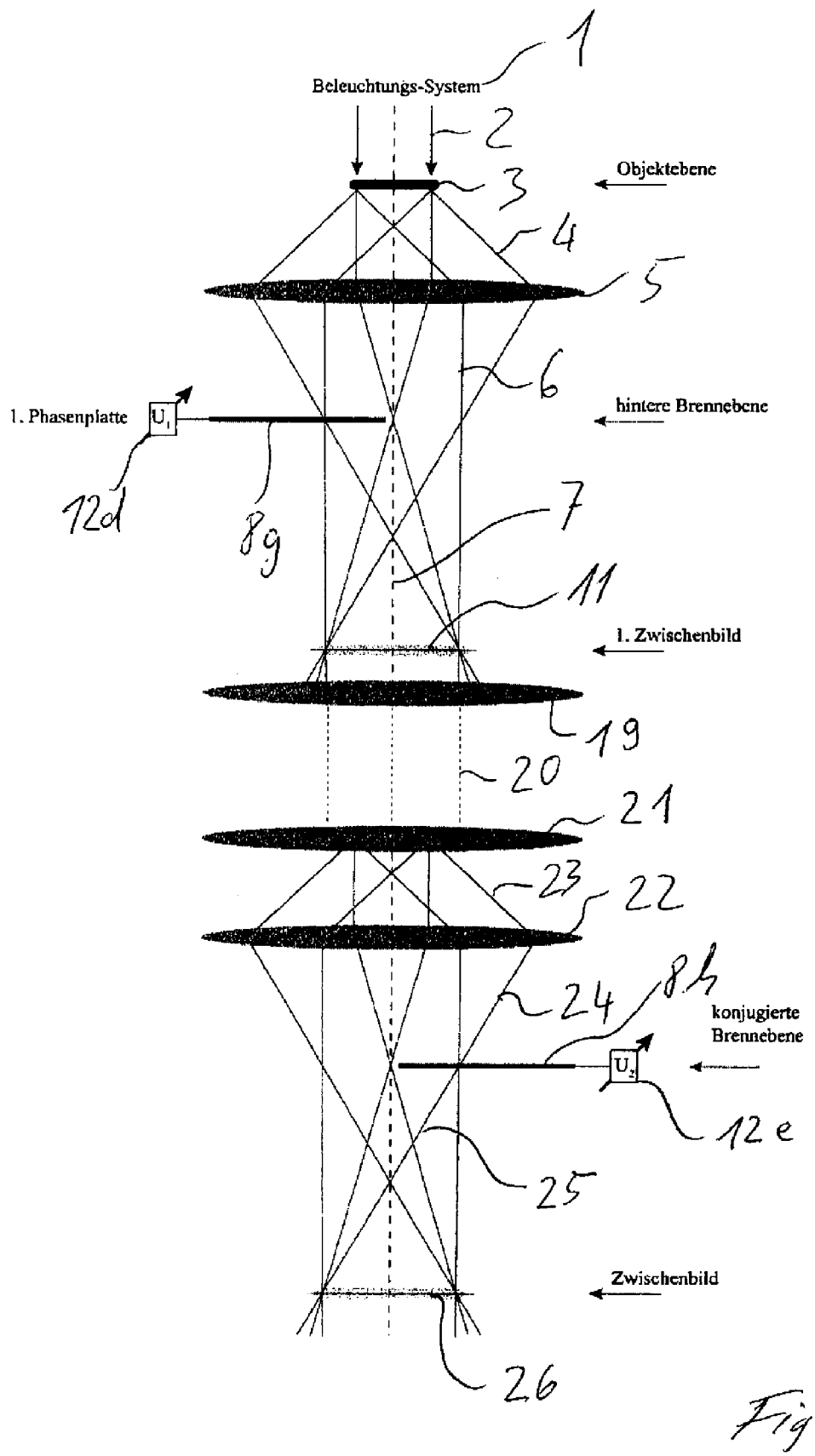

Captions to FIG. 6

| Beleuchtungs-System | Illumination system |
|---|---|
| Objektebene | Object plane |
| hintere Brennebene | Back focal plane |
| 1. Zwischenbild | First intermediate image |
| 1. Phasenplatte | First phase plate |
| konjugierte Brennebene | Conjugate focal plane |
| Zwischenbild | Intermediate image |

Captions to FIGS. 7 and 8

| Phasenverschiebung | Phase shift |
|---|---|

The invention claimed is:

1. A phase plate, in particular for an electron microscope, which is disposed in an electron-beam path and comprising at least one thin film, which thin film is at least partially permeable to electron beams, characterised in that the thin film comprises electrically conductive material, is connected to a predeterminable electrical voltage and is equipped with at least one through-hole, wherein the phase plate is not electrically grounded.

2. The phase plate according to claim 1, wherein the phase plate is aligned perpendicular relative to an optical axis of the electron microscope with the through-hole extending in the direction of progression of the electron beam path.

3. The phase plate according to claim 1, wherein the through-hole is disposed in the centre of a surface of the phase plate, preferably on the optical axis of the electron microscope.

4. The phase plate according to of claim 1, wherein the through-hole is circular in cross-section with a radius in a range of 0.1-20 μm, preferably 0.3-0.8 μm, or rectangular.

5. The phase plate according to claim 1, wherein the phase plate is disposed, relative to an object to be observed, in a back focal plane of an objective lens.

6. The phase plate according to claim 1, wherein the voltage applied to the phase plate (with respect to earth) is unequal to a voltage present at the output of an electron source of the transmission electron microscope.

7. The phase plate according to claim 1, wherein the voltage applied to the phase plate is adjusted in a manner such that a relative phase shift from unscattered electron waves of the electron beams passing through the through-hole to scattered electron waves of the electron beams passing through the conductive material is up to ±90°.

8. The phase plate according to claim 1, wherein the thin film is disposed, at least partially, on a carrier film, preferably made of amorphous material.

9. The phase plate according to claim 1, wherein the thin film comprises an electrically conductive, preferably amorphous, material, such as gold, aluminium, silver, platinum, titanium and alloys thereof.

10. The phase plate according to claim 1, wherein the thin plate exhibits a film thickness in a range of 0.1-50 nm, preferably 0.3-1.0 nm and the carrier film exhibits a film thickness in a range of 1-100 nm, preferably 5-20 nm.

11. The phase plate according to claim 1, wherein the phase plate is disposed in a group of phase plates disposed one above the other along the electron beam path.

12. The phase plate according to claim 1, wherein, including in a phase-plate group, the phase plate covers at least sections, preferably a half-plane of a diffraction-image plane, within the electron microscope.

13. An electron microscope, equipped with at least one phase plate in accordance with claim 1.

* * * * *